United States Patent
Wang et al.

(10) Patent No.: US 8,673,765 B2
(45) Date of Patent: Mar. 18, 2014

(54) METHOD AND APPARATUS FOR BACK END OF LINE SEMICONDUCTOR DEVICE PROCESSING

(75) Inventors: Hung-Chih Wang, Hsin-Chu (TW); Wei-Rong Chen, New Taipei (TW); Yao Hsiang Liang, Hsin-Chu (TW); Chen-Kuang Lien, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/486,006

(22) Filed: Jun. 1, 2012

(65) Prior Publication Data

US 2013/0320539 A1    Dec. 5, 2013

(51) Int. Cl.
*H01L 21/4763* (2006.01)

(52) U.S. Cl.
USPC .......................................... 438/624; 438/622

(58) Field of Classification Search
USPC ................................... 438/622, 624
See application file for complete search history.

(56) References Cited

U.S. PATENT DOCUMENTS

| | | | |
|---|---|---|---|
| 2003/0124826 A1* | 7/2003 | Kim | 438/592 |
| 2005/0064699 A1* | 3/2005 | Kondo et al. | 438/624 |
| 2005/0215051 A1* | 9/2005 | Yang et al. | 438/624 |
| 2006/0024955 A1* | 2/2006 | Frohberg et al. | 438/636 |
| 2008/0293205 A1* | 11/2008 | Kwon et al. | 438/293 |

* cited by examiner

*Primary Examiner* — Kyoung Lee
*Assistant Examiner* — Ratisha Mehta
(74) *Attorney, Agent, or Firm* — Slater & Matsil, L.L.P.

(57) ABSTRACT

Methods and apparatus are disclosed for the back end of line process for fabrication of integrated circuits (ICs). The inter-metal dielectric (IMD) layer between two metal layers may comprise an etching stop layer over a metal layer, a low-k dielectric layer over the etching stop layer, a dielectric hard mask layer over the low-k dielectric layer, an nitrogen free anti-reflection layer (NFARL) over the dielectric hard mask layer, and a metal-hard-mask (MHM) layer of a thickness in a range from about 180 Å to about 360 Å over the NFARL. The MHM layer thickness is optimized at the range from about 180 Å to about 360 Å to reduce the Cu pits while avoiding the photo overlay shifting issue.

20 Claims, 4 Drawing Sheets

Figure 2(a)

METHOD AND APPARATUS FOR BACK END OF LINE SEMICONDUCTOR DEVICE PROCESSING

BACKGROUND

Generally, integrated circuits (ICs) comprise individual devices, such as transistors, capacitors, or the like, formed on a substrate. One or more metal layers are then formed over the individual devices to provide connections between the individual devices and to provide connections to external devices. The front-end-of-line (FEOL) is the first portion of IC fabrication where the individual devices (transistors, capacitors, resistors, etc.) are patterned in a wafer. FEOL generally covers everything up to (but not including) the deposition of metal layers. The back end of line (BEOL) is the second portion of IC fabrication where the individual devices get interconnected with wiring or metal layers on the wafer. BEOL generally begins when the first metal layer is deposited on the wafer. It includes contacts, insulating layers, metal layers, and bonding sites for chip-to-package connections.

The metal layers interconnecting individual devices typically comprise an inter-metal dielectric (IMD) layer in which interconnect structures, such as vias and conductive lines, are formed, through numerous and repetitive steps of deposition, patterning and etching of thin films on the surface of silicon wafer. While aluminum and aluminum alloys were most frequently used in the past for the metal layers, the current trend is to use copper (Cu) for metal layers because copper has better electrical characteristics than aluminum, such as decreased resistance, higher conductivity, and a higher melting point.

When Cu is used as the material to form metal layers, with the continual reductions in minimum feature sizes, there is an increase on the Cu pit defects which causes more yield losses. Therefore methods and apparatus for improvements are needed for BEOL with Cu for metal layers.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2(a)-2(c) illustrate an embodiment method of a back end of line (BEOL) semiconductor device processing where multiple metal layers are made.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

Methods and apparatus are disclosed for the back end of line process for fabrication of integrated circuits (ICs). The inter-metal dielectric (IMD) layer between two metal layers may comprise an etching stop layer on a metal layer, a low-k dielectric layer on the etching stop layer, a dielectric hard mask layer on the low-k dielectric layer, a nitrogen free anti-reflection layer (NFARL) on the dielectric hard mask layer, and a metal-hard-mask (MHM) layer of a thickness in a range from about 180 Å to about 360 Å on the NFARL. The MHM layer thickness is optimized at the range from about 180 Å to about 360 Å to reduce the Cu pits while avoiding the photo overlay shifting issue.

Figure 1:
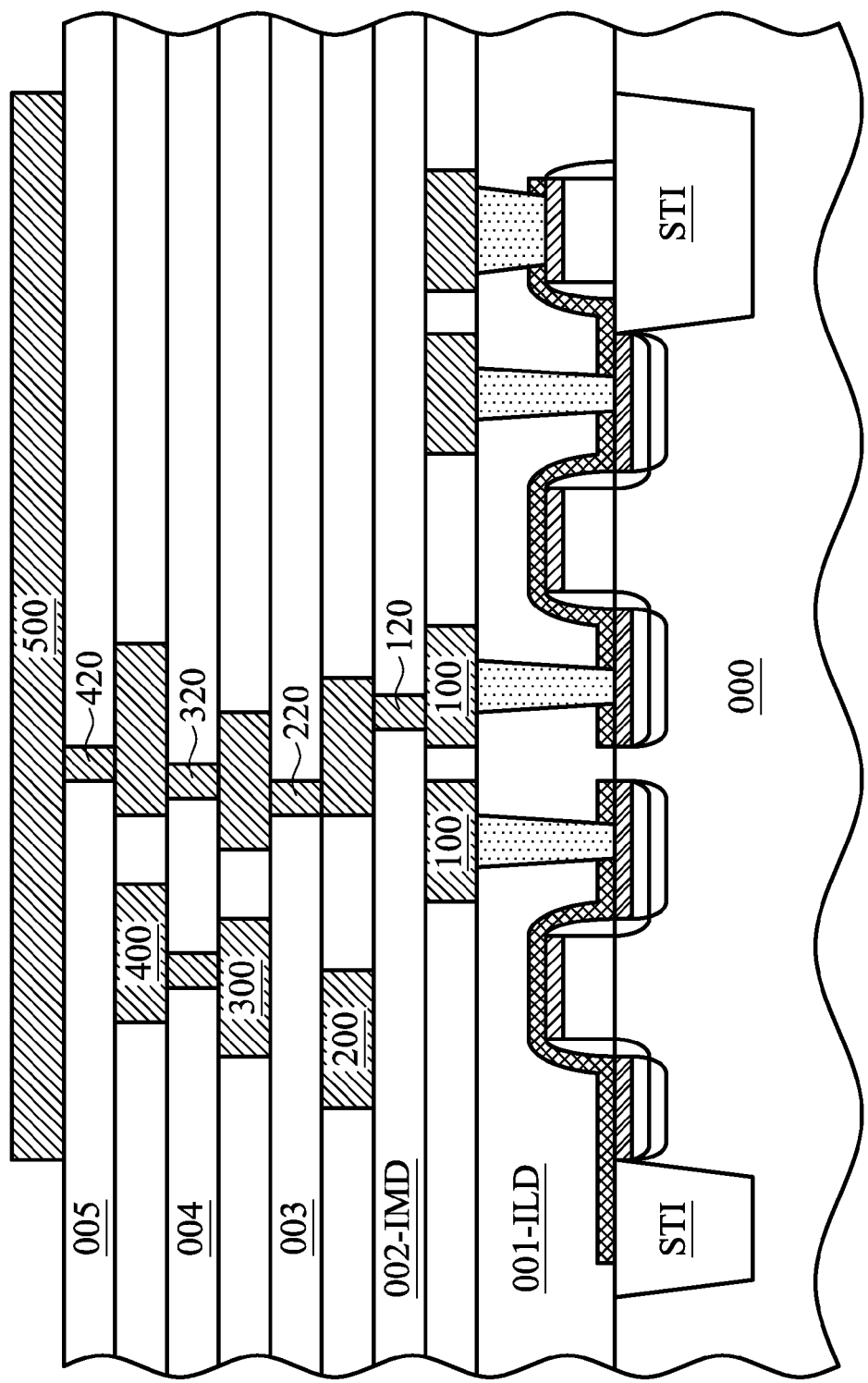
FIG. 1 illustrates an embodiment of various metal layers formed on individual devices of an integrated circuit (IC)

FIG. 1 is an illustrative integrated circuit (IC) comprising individual devices, such as transistors, capacitors, or the like, formed on a substrate 000. One or more metal layers 100, 200, 300, 400, and 500 are then formed over the individual devices to provide connections among the individual devices and to provide connections to external devices. On top of the substrate layer 000 is a layer 001 which is the first inter-layer dielectric (ILD) between a first metal layer and the substrate layer 000. On top of the ILD layer 001 is the first metal layer 100, where a plurality of metal contacts are located and connected to the devices within the substrate layer by vias through the ILD layer 001. The first metal layer 100 may be called the metal layer $M_1$. A second metal layer 200, which may be called the metal layer $M_2$, is located on top of the first metal layer 100 separated by an inter-metal dielectric (IMD) layer 002. Similarly, additional metal layers 300, 300, 400, and 500 are formed on top of each other and separated by IMD layers 002, 003, 004, and 005 respectively. Metal contacts between different metal layers are connected by vias such as via 120, 220, 320, and 420. The number of metal layers 100 to 500 and the number of vias connecting the metal layers are only for illustrative purposes and are not limiting. There could be other number of layers that is more or less than the 5 metal layers shown in FIG. 1.

The bottom layer 000 is the substrate layer 000 where a plurality of drain and source regions of transistors may be formed. The substrate layer 000 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The substrate 000 may comprise electrical devices such as various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like.

Shallow trench isolations (STIs), or other isolation structures, may be formed in substrate 000 to isolate device regions. STIs may be formed by etching substrate 000 using photolithography techniques to form recesses. Generally, photolithography involves depositing a photoresist material, which is then masked, exposed, and developed. After the photoresist mask is patterned, an etching process may be performed to remove unwanted portions of the substrate 000. In an embodiment in which the substrate comprises bulk silicon, the etching process may be a wet or dry, anisotropic or isotropic, etching process. The recesses are then filled with a dielectric material such as an oxide layer formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. A planarization step may be performed to planarize the surface of the isolation material with a top surface of the substrate 000. The planarization step may be accomplished, for example, using a chemical mechanical polishing (CMP) process known and used in the art.

A first insulating layer 001, e.g., an inter-layer dielectric (ILD) layer, is formed over the substrate 000. The ILD layer 001 may comprise a low dielectric constant (k value less than about 3.0) or an extreme low dielectric constant (k value less than about 2.5) material. For example, the ILD layer 001 may comprise an oxide, $SiO_2$, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS). A planarization process, such as a CMP process, may be performed to planarize the ILD layer 001.

The process forming the individual devices such as transistors, capacitors, resistors, diodes, photo-diodes, fuses, STIs, and the like, within the substrate 000 and the ILD layer 001 may be collectively referred as the front-end-of-line (FEOL) process, which is the first portion of IC fabrication where the individual devices (transistors, capacitors, resistors, etc.) are patterned in a wafer. FEOL generally covers everything up to (but not including) the deposition of metal layers.

Following the FEOL process is the back end of line (BEOL) process, which is the second portion of IC fabrication where the individual devices are interconnected with wiring or metal layers 100 to 500 on the IC as shown in FIG. 1. The BEOL process generally begins when the first metal layer 100 or $M_1$ is deposited on the wafer. It includes contacts, insulating layers, metal layers, and bonding sites for chip-to-package connections. As the result, the metal layers 100 to 500 as illustrated in FIG. 1, or one or more metal layers $M_1$-$M_n$ in general, may be formed over the ILD layer 001. A typical IC may comprise three or more metal layers, followed by a final passivation layer, not shown in FIG. 1. The final passivation layer may be used for protecting the IC from mechanical abrasion during probe and packaging and to provide a barrier to contaminants. After the final passivation layer, the bond pads for input/output will be opened, followed by the normal post-fabrication process such as wafer probe, die separation, and packaging.

In more details, the BEOL process may comprise a sequence of steps: adding a metal layer $M_i$, adding an intrametal dielectric (IMD) layer, making vias through the IMD layer to connect to lower metal layer contacts, and forming higher metal layer contacts connected to the vias, or creating vias and conductive lines of a higher metal layer by etching via holes and trenches for the conductive lines at the same time.

The metal layers 100 to 500 as illustrated in FIG. 1, or one or more metal layers $M_1$-$M_n$ in general, may be formed of any suitable conductive material, such as a highly-conductive metal, low-resistive metal, elemental metal, transition metal, or the like. In an embodiment the metal layers $M_1$-$M_n$ may be formed of copper, although other materials, such as tungsten, aluminum, gold, or the like, could alternatively be utilized. Copper has a more desirable thermal conductivity and is available in a highly pure state. In an embodiment in which the metal layers $M_1$-$M_n$ are formed of copper, the metal layers $M_1$-$M_n$ may be deposited by electroplating techniques, although any method of formation could alternatively be used.

Copper is difficult to etch and achieve a precise pattern. When the metal material is copper, the metal layers 100 to 500 as illustrated in FIG. 1, or one or more metal layers $M_1$-$M_n$ in general, may be formed, using a plating and etching process through a damascene or dual-damascene process, in which openings are etched into the corresponding dielectric layer and the openings are filled with a conductive material such as Cu. The damascene process means formation of a patterned layer imbedded on and in another layer such that the top surfaces of the two layers are coplanar. An IMD is deposited either directly on a substrate, or on top of another existing metal layer. Once the IMD is deposited, portions of the IMD may be etched away to form recessed features, such as trenches and vias, which can connect different regions of the IC and accommodate the conductive lines. A damascene process which creates either only trenches or vias is known as a single damascene process. A damascene process which creates both trenches and vias at once is known as a dual damascene process. Damascene and dual-damascene processes use lower resistance metals such as copper to form many metal elements (e.g. lines, interconnects, and the like) instead of the conventionally used aluminum.

Interconnections between different metal layers are made by vias, such as the vias 120, 220, 320, and 420 as shown in FIG. 1. Vias go through insulating IMD layers separating multiple metal layers, and allow for communication between interconnects of other metal layers or directly with the semiconductor devices in the substrate.

The metal layers 100 to 500 shown in FIG. 1 are separated by IMD layers 002 to 005. The IMD layers 002 to 005 may comprise multiple sub-layers. The IMD layers 002 to 005 may comprise a low dielectric constant or an extreme low dielectric constant (ELK) material, such as an oxide, $SiO_2$, borophosphosilicate glass (BPSG), TEOS, spin on glass (SOG), undoped silicate glass (USG), fluorinated silicate glass (FSG), high-density plasma (HDP) oxide, or plasma-enhanced TEOS (PETEOS). A planarization process, such as a chemical-mechanical polish (CMP) process, may be performed to planarize the various IMD layers. An exemplary IMD layer separating a lower metal layer and a higher metal layer will be illustrated in FIGS. 2(*a*)-2(*c*).

Figure 2A:
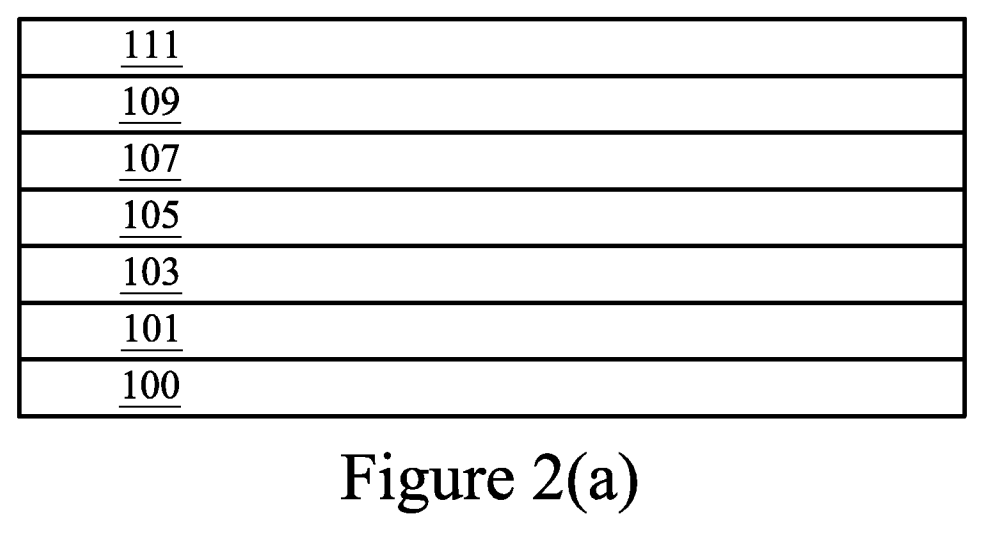

As illustrated in FIG. 2(*a*), a lower metal layer 100 is shown as the bottom layer. The lower metal layer 100 may be any of the metal layers 100 to 500 shown in FIG. 1, which may be or may not be the first metal layer above the ILD layer 001. A plurality of layers such as the layers 101, 103, 105, 107, and 109 of different materials may be formed on the low metal layer 100 before the next metal layer is formed. Those layers 101, 103, 105, 107, and 109 may be parts of an IMD layer between the two metal layers, and they are deposited by methods including chemical vapor deposition (CVD), plasma enhanced chemical vapor deposition (PECVD), high density plasma chemical vapor deposition (HDP-CVD) and atmospheric pressure chemical vapor deposition (APCVD).

As illustrated in FIG. 2(*a*), an etching stop layer 101 may be formed on the first metal layer 100. In addition to signaling the termination point of an etching process, the etching stop layer 101 protects any underlying layer or layers during the etching process. The etching stop layer 101 may comprise a plurality of layers. Materials for the etching stop layer 101 may include SiC, SIN, TEOS, hard black diamond (HBD), or the like. Alternatively, the etching stop layer 101 may be formed by depositing and annealing a metal oxide material, which may include hafnium, hafnium oxide (HfO2), or aluminum.

A low-k dielectric layer 103 may be formed on the etching stop layer 101. The low-k dielectric layer 103 may comprise a material, such as an oxide, $SiO_2$, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS). The low-k dielectric material may comprise a SiOC-based spin-on material that can be applied to or deposited by a spin-on method, such as spin coating. Alternatively, the low-k dielectric material may be deposited by a chemical vapor deposition (CVD). A low-k dielectric layer 103 may be formed to a thickness of from about 300 to about 1200 angstroms.

A dielectric hard mask (ESLK) layer 105 may be formed on the low-k dielectric layer 103, to prevent the kink defect. The etching methods employed are often destructive, and require a non-reactive dielectric hard mask layer formed over the low-k dielectric layer as an etching mask layer. Typically such dielectric hard mask layers are formed of silicon containing dielectric materials such as silicon nitride employing methods such as plasma enhanced chemical vapor deposition (PECVD), high density plasma chemical vapor deposition (HDP-CVD) and atmospheric pressure chemical vapor deposition (APCVD).

A nitrogen free anti-reflection layer (NFARL) 107, which may be called anti-reflective coating (ARC), may be formed on the dielectric hard mask layer 105. Forming damascene structures requires the use of lithographic processes. Many of the underlying material layers may comprise energy sensitive resist materials which are reflective to ultraviolet light used in the lithographic processes. These reflections can distort the dimensions of features such as lines and vias that are formed in the energy sensitive material. Anti-reflective coating (ARC) or anti-reflection layer (ARL) may be used to minimize reflections from an underlying material layer. The ARC suppresses the reflections of the underlying material layer during resist imaging, providing accurate pattern replication in the layer of energy sensitive resist. Conventional ARC materials may contain nitrogen, including silicon nitride and titanium nitride. Nitrogen in the ARC layer may chemically alter the composition of the photoresist material. The chemical reaction between nitrogen and the photoresist material is referred to as photoresist poisoning. The altered photoresist material may not be lithographically patterned as expected and result in imprecisely formed features in the photoresist material, which can detrimentally affect subsequent processes, such as etching processes. Therefore a nitrogen free anti-reflection layer (NFARL) is used as the preferred layer 107 over the dielectric hard mask layer 105.

A metal-hard-mask (MHM) layer 109 may be formed on the NFARL layer 107. Previously the NFARL 107 has been used without MHM layer, where the NFARL 107 may induce bad etch selectivity and poor Cu fill opening shape, with further damages to the low-k dielectric layer 103. The MHM layer may comprise TiN material. The MHM layer may comprise other material such as Ti, Ta, W, TaN or WN. The MHM layer may be used to control the size of the trench or via openings. It is found and disclosed here that the critical dimension (CD) of a trench opening has a linear correlation with the MHM layer thickness. The CD of a trench opening may be enlarged linearly by a thicker TiN film because the thickness of a TiN film will influence the Cu seed profile on a patterned structure. Even though the current trend is to have a thinner and thinner MHM layer, the present disclosure recognizes the unexpected result that a thickness less than about 170 Å for the MHM layer may result in a small critical dimension opening, which may cause more Cu pit defects leading to a higher yield loss. For pits improvement, the MHM layer thickness needs to be larger than about 180 Å. However, it is not as simple as to increase the MHM layer to a greater thickness. It is found and disclosed here the previously unrecognized phenomena that a thickness larger than about 360 Å for the MHM layer thickness may induce the photo overlay shift issue. This photo overlay shift issue is a previously unrecognized and, in fact, surprising consequence of a too thick MHM layer. Therefore an illustrative MHM layer thickness may be in a range from about 180 Å to about 360 Å to reduce the Cu pits while avoid the photo overlay shifting issue.

A photoresist layer 111 may be formed on the MHM layer 109, which may be a TiN layer. The photoresist layer 111 may comprise adhesive agents, sensitizers and solvents. It may be a positive or a negative resist. The photoresist layer 111 may be formed by spin on methods on a rotating chuck.

Figure 2B:
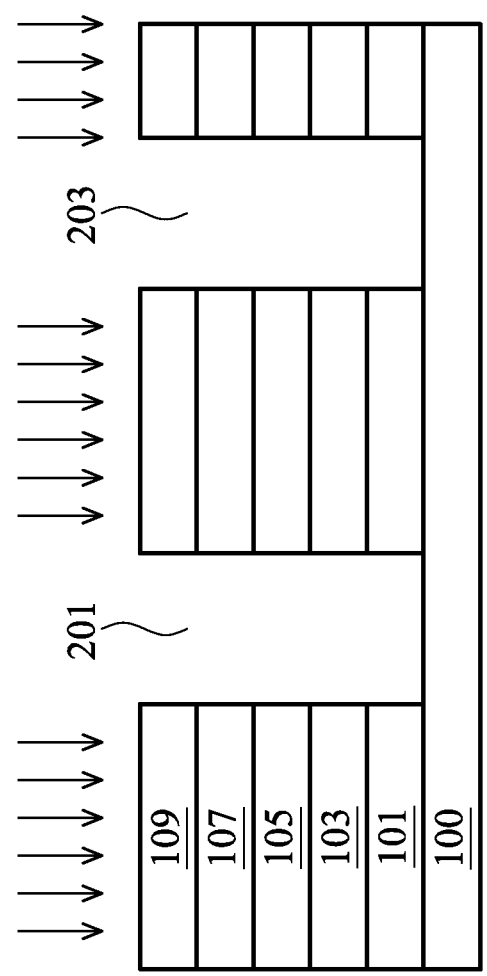

As illustrated in FIG. 2(b), a single or dual damascene process may be employed to create vias and conductive lines of a higher metal layer. The dual damascene process may be the via first trench last (VFTL) or the trench first via last (TFVL) approach. The layers comprising layer 101, 103, 105, 107, and 109 are etched to create via openings, or via holes, and trenches 201 and 203 for conduction paths, as shown in FIG. 2(b). The via opening and trench 201 and 203 are defined by the photoresist patterns at the photoresist layer 111. The metal-hard-mask (MHM) layer 109, the nitrogen free anti-reflection layer 107, the dielectric hard mask (ESLK) layer 105, and the low-k dielectric layer 103 are etched, for example, in a anisotropic dry etching process until the etching stop layer 101 is reached to form the via opening and the trench where a via and a conductive line will be formed.

A liner layer, not shown, may be formed over the dielectric layer in the openings 201 and 203, covering the sidewalls and bottom of the openings 201 and 203. The liner may be either tetraethylorthosilicate (TEOS) or silicon nitride, although any suitable dielectric may alternatively be used. The liner may be formed using a plasma enhanced chemical vapor deposition (PECVD) process, although other suitable processes, such as physical vapor deposition or a thermal process, may alternatively be used.

Figure 2C:
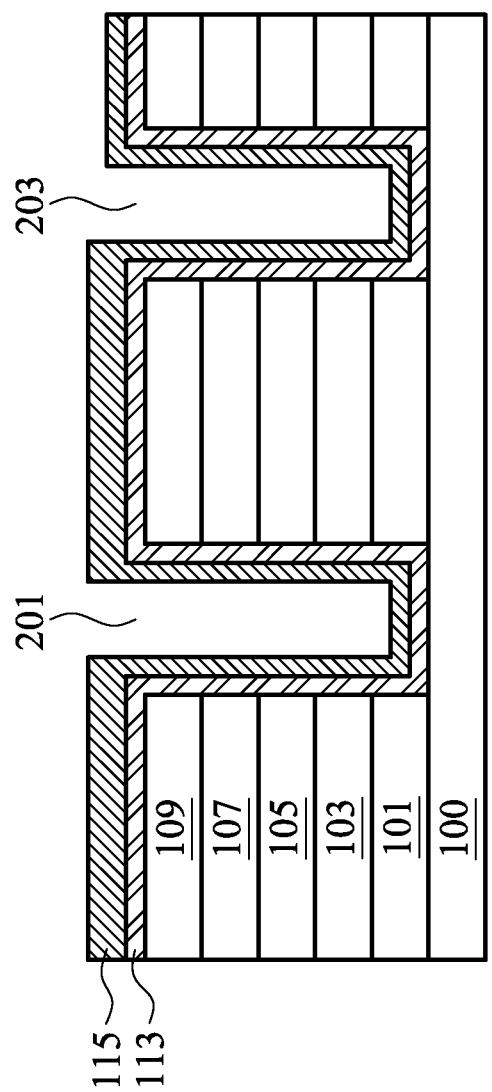

As illustrated in FIG. 2(c), a thin barrier layer 113 may be formed over the liner, if present, or may be deposited covering the sidewalls and a bottom of the openings 201 and 203. The barrier layer 113 may be formed using a process such as chemical vapor deposition (CVD), physical vapor deposition (PVD), plasma enhanced CVD (PECVD), plasma enhanced physical vapor deposition (PEPVD), atomic layer deposition (ALD), combinations of these, or the like. The barrier layer may comprise tantalum nitride, although other materials, such as tantalum, titanium, titanium nitride, combinations of these, and the like may alternatively be used. A thin barrier film is used to prevent copper diffusion into the dielectric.

A seed layer 115 may be formed on the barrier layer 113 to get a good electrode surface, such that high quality plating may be obtained for the Cu to be deposited in the next step. The seed layer is a thin Cu layer on the surface on which a metal layer will be plated. The chemical vapor deposition (CVD) may be used to deposit the seed layer 115.

A conductive material such as Cu, not shown, may be deposited over the seed layer 115, into the openings 201 and 203, to form the vias and the conductive lines for the next metal layer of the IC. The conductive material may be formed by an electro-chemical plating process, CVD, ALD, PVD, a combination thereof, and/or the like. A planarization process, such as a chemical mechanical polishing (CMP) process, may be used to planarize and/or remove excess material.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of fabricating an integrated circuit (IC) comprising:
    forming an etching stop layer over a metal layer;
    forming a low-k dielectric layer over the etching stop layer;
    forming a dielectric hard mask layer over the low-k dielectric layer;
    forming a nitrogen free anti-reflection layer (NFARL) over the dielectric hard mask layer; and
    forming a metal-hard-mask (MHM) layer of a thickness in a range from about 180 Å to about 360 Å over the NFARL.

2. The method of claim 1, wherein the MHM layer comprises a material of TiN.

3. The method of claim 1, wherein the etching stop layer comprises a material selected from a group consisting essentially of SiC, SIN, tetra-ethyl-ortho-silicate (TEOS), or hard black diamond (HBD).

4. The method of claim 1, wherein the low-k dielectric layer comprises a material selected from a group consisting essentially of oxide, SiO2, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS).

5. The method of claim 1, wherein the dielectric hard mask layer comprises silicon nitride.

6. The method of claim 1, further comprising:
    forming a via opening going through the MHM layer, the NFARL, the dielectric hard mask layer, the low-k dielectric layer, and stopping at the etching stop layer; and
    forming a trench connected to the via opening.

7. The method of claim 6, wherein the via opening and the trench are formed together by a dual damascene process.

8. The method of claim 7, wherein the dual damascene process is a via first trench last (VFTL), or a trench first via last (TFVL) approach.

9. The method of claim 6, further comprising:
    depositing a barrier layer covering sidewalls and a bottom of the via opening and sidewalls of the trench;
    depositing a seed layer over the barrier layer; and
    forming a via and a contact within the via opening and the trench.

10. The method of claim 9, wherein the barrier layer comprises a material selected from a group consisting essentially of tantalum nitride, tantalum, titanium, and titanium nitride.

11. The method of claim 9, wherein the seed layer comprises copper (Cu).

12. A device comprising:
    an etching stop layer over a metal layer;
    a low-k dielectric layer over the etching stop layer;
    a dielectric hard mask layer over the low-k dielectric layer;
    an nitrogen free anti-reflection layer (NFARL) over the dielectric hard mask layer; and
    a metal-hard-mask (MHM) layer of a thickness in a range from about 180 Å to about 360 Å over the NFARL.

13. The device of claim 12, wherein the MHM layer comprises a material of TiN.

14. The device of claim 12, wherein the etching stop layer comprises a material selected from a group consisting essentially of SiC, SIN, tetra-ethyl-ortho-silicate (TEOS), or hard black diamond (HBD).

15. The device of claim 12, wherein the low-k dielectric layer comprises a material selected from a group consisting essentially of oxide, SiO2, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS).

16. The device of claim 12, wherein the dielectric hard mask layer comprises silicon nitride.

17. The device of claim 12, further comprising:
    a via opening going through the MHM layer, the NFARL, the dielectric hard mask layer, the low-k dielectric layer, and stopping at the etching stop layer; and
    a trench connected to the via opening;
    a barrier layer covering sidewalls and a bottom of the via opening and sidewalls of the trench;
    a seed layer over the barrier layer; and
    a via and a contact within the via opening and the trench.

18. The device of claim 17, wherein the barrier layer comprises a material selected from a group consisting essentially of tantalum nitride, tantalum, titanium, and titanium nitride.

19. A method of fabricating an integrated circuit (IC) comprising:
    forming an etching stop layer over a metal layer;
    forming a low-k dielectric layer over the etching stop layer;
    forming a dielectric hard mask layer over the low-k dielectric layer;
    forming an nitrogen free anti-reflection layer (NFARL) over the dielectric hard mask layer;
    forming a metal-hard-mask (MHM) layer of a thickness in a range from about 180 Å to about 360 Å over the NFARL;
    forming a via opening going through the MHM layer, the NFARL, the dielectric hard mask layer, the low-k dielectric layer, and stopping at the etching stop layer;
    forming a trench connected to the via opening;
    depositing a barrier layer covering sidewalls and a bottom of the via opening and sidewalls of the trench;
    depositing a seed layer over the barrier layer; and
    forming a via and a contact within the via opening and the trench.

20. The method of claim 19, wherein the MHM layer comprises a material of TiN.

* * * * *